US010818577B2

(12) United States Patent
Miehl et al.

(10) Patent No.: US 10,818,577 B2
(45) Date of Patent: Oct. 27, 2020

(54) MICROPHONE PACKAGING FOR A PORTABLE COMMUNICATION DEVICE

(71) Applicant: MOTOROLA SOLUTIONS, INC, Chicago, IL (US)

(72) Inventors: Andrew P Miehl, Boca Raton, FL (US); Kathryn Johnson, Coconut Creek, FL (US); Deborah A Gruenhagen, Southwest Ranches, FL (US); Rammone Bartlett, Delray Beach, FL (US); Karl F Mueller, Sunrise, FL (US); Ido Amit, Boynton Beach, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/225,032

(22) Filed: Dec. 19, 2018

(65) Prior Publication Data

US 2020/0203257 A1 Jun. 25, 2020

(51) Int. Cl.
*H01L 23/488* (2006.01)
*H05K 1/11* (2006.01)
*H01L 23/00* (2006.01)
*H05K 1/18* (2006.01)
*H04R 1/04* (2006.01)

(52) U.S. Cl.
CPC .......... *H01L 23/488* (2013.01); *H01L 24/26* (2013.01); *H04R 1/04* (2013.01); *H05K 1/111* (2013.01); *H05K 1/189* (2013.01)

(58) Field of Classification Search
CPC ............. H04R 2201/003; H04R 31/006; H04R 19/04; H04R 2499/11
See application file for complete search history.

(56) References Cited

U.S. PATENT DOCUMENTS

| 9,628,929 | B2 | 4/2017 | Salvia et al. | |
|---|---|---|---|---|
| 9,794,661 | B2* | 10/2017 | Watson | H04R 1/023 |
| 2010/0128914 | A1* | 5/2010 | Khenkin | H04R 19/005 |
| | | | | 381/361 |
| 2015/0181346 | A1* | 6/2015 | Jingming | H04R 1/02 |
| | | | | 381/114 |
| 2016/0360333 | A1* | 12/2016 | Higgins | H04R 1/04 |

* cited by examiner

*Primary Examiner* — Jesse Y Miyoshi
(74) *Attorney, Agent, or Firm* — Barbara R. Doutre

(57) ABSTRACT

A microphone packaging assembly (100) provides a printed circuit board (pcb) (106) for coupling to a microphone device (102) having a bottom acoustic port (104). The pcb provides an acoustic port opening (108) which aligns with the bottom acoustic port (104) of the microphone device (102). A solder pad pattern (110) is disposed on the pcb (106). The solder pad pattern (110) is configured to provide both electrical connection (114) and an incomplete solder seal (116) having purposeful acoustic leak to the microphone device (102). A conformable coating (126) provides a seal to the purposeful acoustic leak. A single acoustic test can be performed to detect proper environmental protection and acoustic sealing of the packaged assembly (100).

23 Claims, 7 Drawing Sheets

MICROPHONE PACKAGING FOR A PORTABLE COMMUNICATION DEVICE

FIELD OF THE DISCLOSURE

The present invention relates generally to microphone devices, and more particularly to packaging and environmental protection of a microphone device for a portable communication device.

BACKGROUND

Communication devices, and more particularly portable radio communication devices, are often utilized by public safety personnel, such as fire rescue, law enforcement, and the like. Providing good voice communication is paramount to public safety personnel relying on such devices, particularly when operating under harsh environments, such as wet conditions. Water remaining in an acoustic path of a microphone, for example, may result in muffled, unintelligible audio. In addition to regular voice communication, there is also an increased interest in providing expanded voice features, such as speech recognition and/or voice recording. The addition of such voice features makes the design of portable radio communication devices even more challenging. Traditional burying of a microphone device deep within a product for the purposes of water sealing may degrade acoustic performance thereby making speech recognition more difficult. Tight space constraints, manufacturability, testability, water sealing and ruggedness are all factors that need to be taken into consideration for the placement and packaging of a microphone device.

Accordingly, there is a need for an improved microphone packaging arrangement, particularly an arrangement that can be used in a portable radio communication device.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
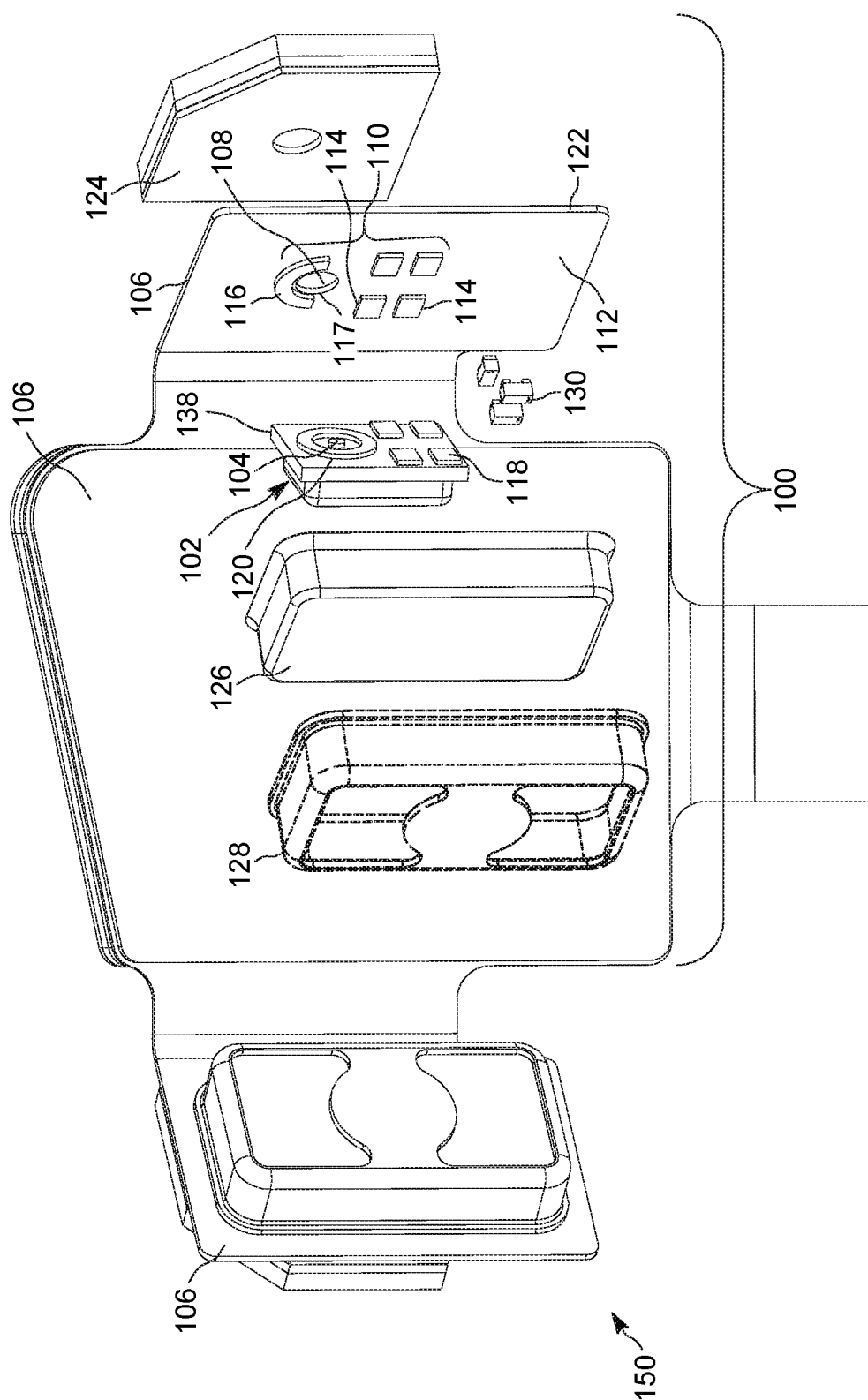
FIG. 1 is an isometric exploded view of a microphone packaging assembly in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, there is provided herein an improved microphone packaging assembly for a surface mountable bottom ported microphone device. The improved microphone packaging assembly features an apparatus comprising a printed circuit board (pcb) having an acoustic opening formed therethrough and a solder pad pattern disposed thereon that is configured for attachment to the bottom ported microphone device, the pcb being further configured to provide both electrical connection and a purposeful acoustic leak to the bottom ported microphone device. The packaging assembly further comprises a conformal coating for closing but not completely penetrating the purposeful acoustic leak. The assembly further comprises a membrane over the acoustic opening of the pcb. The microphone packaging assembly provides for an overall packaged microphone device with the shortest possible acoustic path which is both water sealed and acoustically sealed. The water seal and acoustic seal are particularly advantageous for portable communication products designed to provide a variety of voice features, such as push-to-talk operation and speech recognition, in public safety environments. The sealing provided by the packaged microphone assembly further enables placement of a plurality of packaged microphone devices closer to an outer surface of a portable communication device thereby facilitating beam forming capabilities.

FIG. 1 is an isometric exploded view of a microphone packaging assembly 100 formed in accordance with some embodiments. The microphone packaging assembly 100 provides packaging for a microphone device 102 having a bottom acoustic port 104, such as a bottom-ported surface mountable microelectromechanical (SMT MEMS) microphone device. A complete packaged device is shown as assembled microphone package 150.

The microphone packaging assembly 100 comprises a substrate, such as a printed circuit board (pcb) 106, for coupling to the microphone device 102, the pcb having an acoustic port opening 108 aligning with the bottom acoustic port 104 of the microphone device 102. The pcb 106 is preferably a flexible printed circuit board (FPCB) also referred to as a flex substrate, however other suitable pcb substrates may also be used. While the description of FIG. 1 is directed towards the packaging of a single bottom ported SMT MEMS microphone device, it is to be appreciated that a plurality of such devices may be mounted to the single flex substrate 106.

In accordance with the embodiments, a solder pad pattern 110 is disposed on a first surface 112 of the pcb 106 to provide attachment of the microphone device 102 thereon. A portion of solder pad pattern 110 is configured to provide electrical connection 114 to corresponding electrical contacts 118 of substrate 138 of microphone device 102. The electrical contacts 118 of microphone device 102 may provide for such interface functions as data, power, clock, and select. Depending on the microphone device there may be fewer or greater contacts than shown. The corresponding portion of solder pad pattern 110 providing the electrical connection 114 is disposed on the pcb 106, based on the MEMS footprint.

In accordance with the embodiments, another portion of solder pad pattern 110 is configured to provide an incomplete solder seal 116 having at least one gap 117 for coupling to a continuous solder ring 120 surrounding the bottom acoustic port 104 of the microphone device 102. The solder pad pattern 110 of pcb 106 thus provides both electrical connection and a solder gap providing a purposeful acoustic leak for a bottom ported microphone device. The gap 117 and the incomplete solder seal 116 together establish the purposeful acoustic leak. The continuous solder ring 120 surrounding the bottom acoustic port 104 of microphone device 102 may provide ground (GND). Discrete peripheral electrical components 130 may also be mounted to pcb 106 to provide signal conditioning, filtering and other electronics for the microphone device 102.

As previously mentioned, microphone device 102 is preferably a bottom-ported surface mountable microelectromechanical (SMT MEMS) microphone device. Microphones are transducers that convert acoustic pressure waves to electrical signals, and MEMS microphone devices target audio applications where small size, high sound quality, reliability and affordability are important concerns. In accordance with the embodiments, the bottom ported MEMS microphone device is reflowed only for electrical connection to the first surface 112 of the pcb 106, as the solder pad pattern 110 of pcb 106 is intentionally formed to provide a purposeful acoustic leak at the bottom porting. The solder pattern's 110 incomplete solder seal 116 makes connection to the full circular solder pad 120 of the microphone device 102, while the gap 117 of the solder circle forms the purposeful acoustic leak. The incomplete solder seal 116 provides at least one gap 117 in the acoustic path between the pcb 106 and the bottom acoustic port 104 of microphone device 102.

In accordance with the embodiments, a portion of the solder pad pattern 110 of pcb 106 provides the incomplete solder seal 116, having purposeful acoustic leak, which gets soldered to the circular GND ring 120 of microphone device 102. Past microphone mounting approaches have utilized a complete solder ring pattern to solder to and close off the MEMS circular ring, however such approaches have been susceptible to sealing problems. The incomplete solder seal 116 with purposeful acoustic leak is formed by a non-closed pattern, such as a partial ring solder pattern or some other non-continuous ring pattern, allowing the solder connection to be made with the circular GND ring 120 of microphone device 102 to form at least one gap in the acoustic path between the pcb 106 and the bottom acoustic port 104 of microphone device 102 so as not to completely seal around the entire acoustic port 104. In accordance with the embodiments, microphone device 102 is reflowed to the pcb 106 so as to intentionally retain the purposeful acoustic leak provided by the incomplete solder seal 116.

In accordance with the embodiments, the microphone packaging assembly 100 further comprises a conformal coating 126 which advantageously establishes environmental protection for the bottom ported microphone device 102 and the discrete peripheral components 130 mounted to the pcb 106. In order to ensure acoustic consistency, the conformal coating 126 closes but does not completely penetrate the purposeful acoustic leak of incomplete solder seal 116 thereby forming an environmental seal to the microphone packaging assembly 100 while preserving the open primary acoustic path. The acoustic leak thus provides a built-in acoustic detection feature that will reveal a breach of the potted external acoustic/water seal. The conformal coating 126 is selected for water sealing and for sufficient acoustic properties such that it can be used to detect improper sealing acoustically, for example via frequency sensitivity testing. Examples of suitable conformable coatings may comprise, but are not limited to, epoxy, liquid injection molded silicone, Room Temperature Vulcanizing (RTV) silicone rubber or suitable conformable potting compound.

The conformable coating 126 may be dispensed within a form 128, such as a form made of sheet metal with open surfaces soldered to pcb 106. In accordance with some embodiments, the form 128 defines a volume around the microphone device 102, the volume being filled with the conformal coating 126. The form 128 may be an open-topped form or a partially open topped form attached, preferably soldered, around the microphone device 102 on the first surface 112 of pcb 106. The conformal coating provides an interlocking bond between the form 128, the microphone device 102, and the first surface 112 of the pcb 106. The microphone packaging assembly may be potted, ultrasonically or otherwise, taking advantage of temperature-dependent viscosity properties and/or thixotropic properties of the conformal coating to seal, but not completely penetrate, smaller solder gaps. The use of the conformal coating 126 negates the need any stiffening backer on the second surface 122 of the pcb 106, thereby minimizing piece part count and shortening the acoustic path. Thixotropy is a time-dependent shear thinning property. Certain gels or fluids that are thick, or viscous, under static conditions will flow (become thin, less viscous) over time when shaken, agitated, sheared or otherwise stressed (time dependent viscosity). The assembly may be allowed to rest during the final part of the dispensing operation, taking advantage of thixotropic properties to seal (but not penetrate) larger manufacturing gaps.

In accordance with some embodiments, the microphone packaging assembly 100 further comprises a membrane seal 124 mounted to a second, opposing surface 122 of the pcb 106. The membrane seal 124 covers the acoustic port opening 108 of pcb 106, thereby water sealing microphone port 104 of the microphone device 102. The membrane seal material 124 is a water-proof and air-permeable material suitable for repelling water and maintaining acoustic properties. Hence, the electrical interconnect and purposeful acoustic leak are formed entirely between the microphone device 102 and the first surface 112 of pcb 106, while the water sealing is formed by a combination of the conformal coating 126 on the first surface 112 of pcb 106 and the membrane 124 on the second surface 122 of pcb 106. This approach of water sealing and acoustic sealing beneficially facilitates the ability to mount one or more of such packaged microphone assemblies to an outer surface of a portable communication device. Being able to mount a plurality of MEMS microphone devices packaged within assembly 100 to an outer surface of a portable communication device facilitates beam-forming to provide improved noise-cancellation and mission-critical redundancy.

Both water and acoustic seal integrity can be beneficially verified through a straightforward acoustic test at the flex assembly stage, during final assembly of the communication device, or even during the life of the product.

Figure 2:
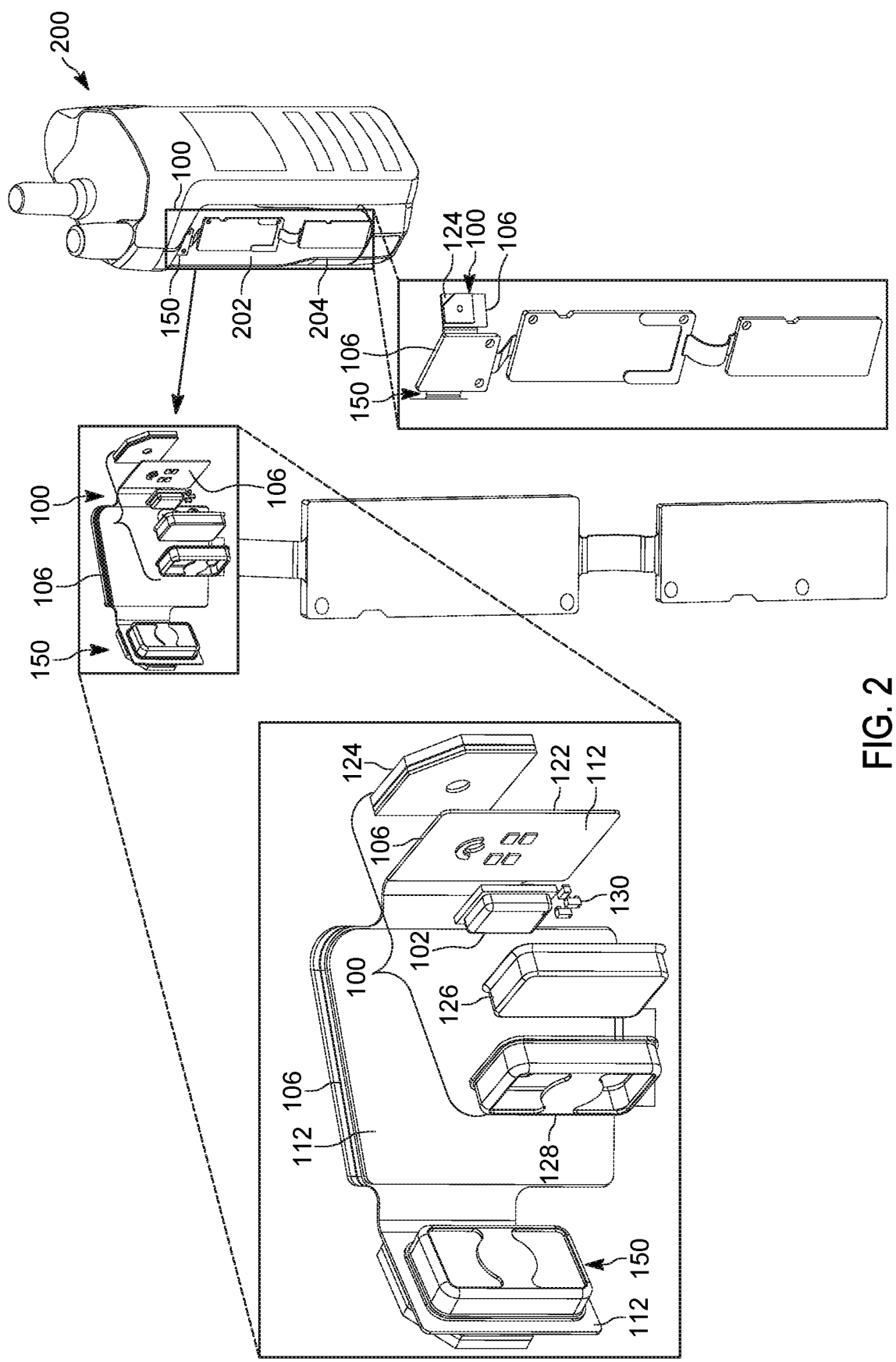
FIG. 2 shows the microphone packaging assembly of FIG. 1 being mounted to a portable radio communication device in accordance with some embodiments.

FIG. 2 shows the microphone packaging assembly of FIG. 1 mounted to an exterior surface 202 of a portable radio communication device 200 in accordance with some embodiments. Although normally covered with a side cover or bezel (not shown), the exterior surface 202 of radio housing 204, even with the bezel, is exposable to wet conditions and thus may be referred to as a wet side of the radio device or as an exposed exterior surface of the device. In this view, it is to be appreciated that a plurality of packaged microphone devices are mounted on remote external oblique surface facets of the device 200. The pcb 106, embodied as a flex pcb substrate, allows for arrays of the packaged assemblies to be located on a variety of facetted surfaces which facilitates the ability to optimize the performance of beam-forming for noise-cancellation and mission-critical redundancy.

Mounting to the exterior surface 202 of the portable radio 200 further ensures shortest acoustic path possible. The implementation of a short path minimizes undesirable acoustic resonances, or more directly stated, "flat," wide-band acoustic sensitivity characteristics are preserved. The preservation of flat, wide-band acoustic sensitivity is important for speech recognition and noise cancellation. Not only is the active acoustic path protected from water ingress by membrane 124, but the body of the MEMS microphone device and discrete peripheral components 130 are also water sealed by conformal coating 126. The water seal protection provides environmental protection impervious to wet, excessively humid, or otherwise corrosive conditions, while the placement and proximity of the packaged microphone assembly to the exterior surface of the portable radio 200 provides for optimized push-to-talk audio applications and speech recognition applications of the portable radio 200.

The microphone packaging assembly is highly advantageous in that both the effectiveness of the water seal and the system acoustic seals are all verifiable via a single acoustic sensitivity response. Examples responses are provided in the accompanying data graphs to illustrate sample results taken at the radio level and at the flex level.

Figure 3:
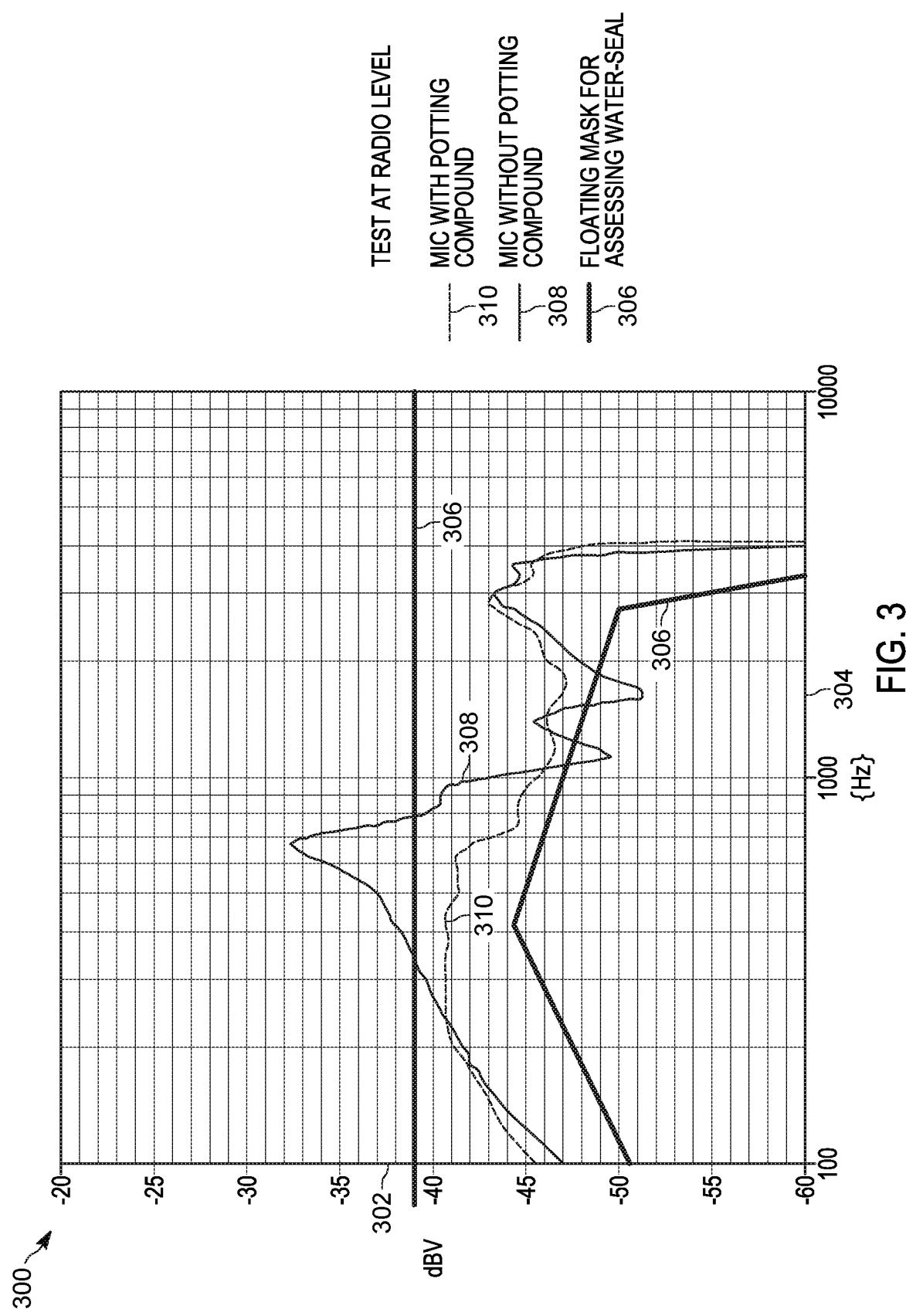
FIG. 3 is an example of a graph comparing microphone sensitivity versus frequency for a microphone device packaged in accordance with some embodiments.

FIG. 3 is a graph 300 showing an example of microphone sensitivity measured in decibel volts (dBV) 302 versus frequency (Hz) 304. Graph 300 compares measurements taken for a bottom ported MEMS microphone device packaged with a purposeful acoustic leak (with compound and without compound), the packaged assembly being mounted to an exterior surface of a portable radio.

Mask 306 represents a predetermined window for assessing predetermined acceptable acoustic performance (which requires both the water seal and acoustic seal to be operating properly). Curve 308 is an example of a microphone device assembled with a purposeful solder leak and no compound. Curve 308 shows peaks and dips in frequency response which will vary depending on the size of the leak in the seal. Generally, a leak has a sharp dip as part of its signature. Curve 310 is the response obtained using the same microphone device after having the purposeful solder leak sealed with the conformal coating. The curve 310 illustrates how the microphone packaging assembly with purposeful solder leak with compound falls within acceptable window of the mask 306. The graph 300 thus demonstrates the ability to achieve a good frequency response with a microphone packaged in accordance with the embodiments.

Figure 4:
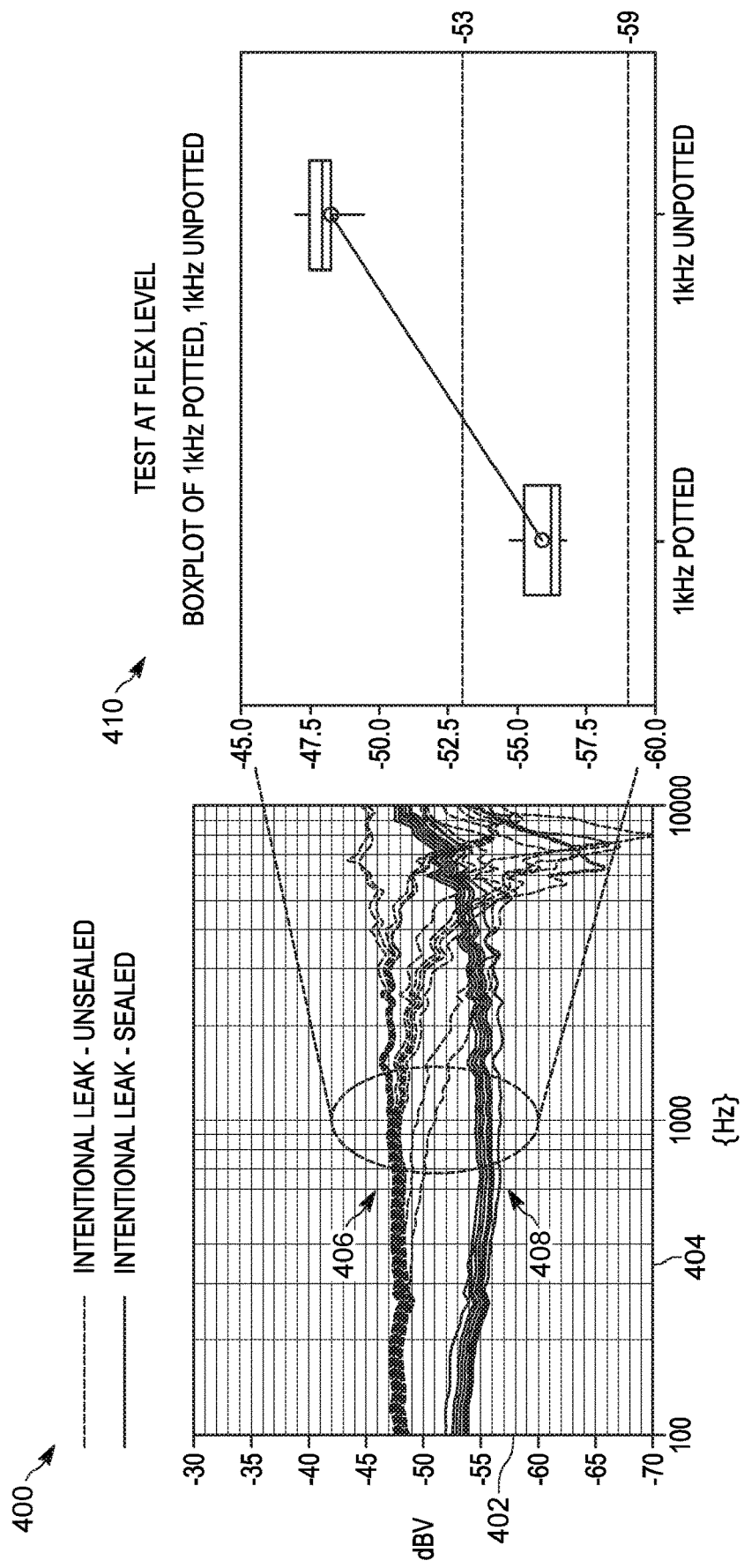
FIG. 4 is an example of a graph comparing microphone sensitivity versus frequency for a plurality of microphone devices packaged in accordance with some embodiments.

FIG. 4 is a graph 400 showing another example of microphone sensitivity measured in decibel volts (dBV) 402 versus frequency (Hz) 404 taken for a plurality of packaged microphone devices. Graph 400 shows data for plurality of microphone devices tested at the flex level (independently of the radio). Curve population 406 represents microphone devices with an intentional leak but no potting sealing. This grouping would be rejected. Curve 408 represents a population of microphone devices with an intentional leak and the potting sealing. A breakaway view at boxplot 410 shows that a test being performed at 1 KHz will detect properly potted versus unpotted microphone devices.

The data from graphs 300 and 400 further supports the preservation of flat, wide-band acoustic sensitivity which is important for speech recognition and noise cancellation. Accordingly, the ability to easily detect proper environmental sealing and acoustic sealing can be performed using a single test. Providing the purposeful acoustic leak makes it possible to use an acoustic signal sensed by the microphone to distinguish between a well sealed assembly versus a leaky assembly through an audio test, rather than traditional vacuum tests. Those skilled in the art can appreciate that different or additional testing mechanisms and parameters might also be applied, however the use of a single frequency test is highly advantageous in terms of ease facilitating manufacturability.

Figure 5A:
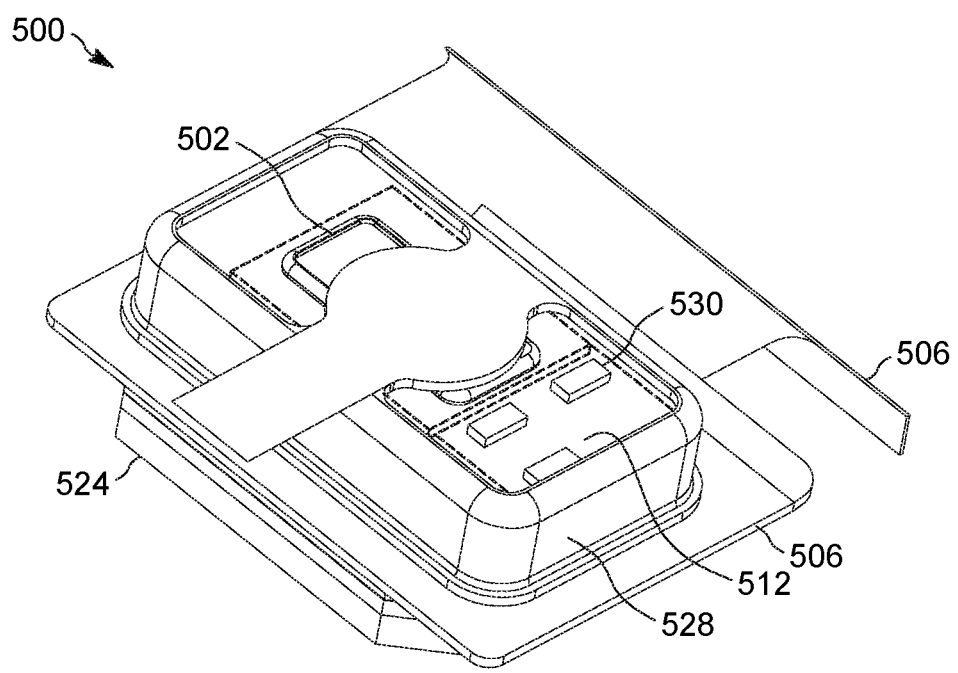
FIGS. 5A, 5B, 5C show assembled and cross-sectional views of a microphone packaging assembly in accordance with some embodiments.
Figure 5B:
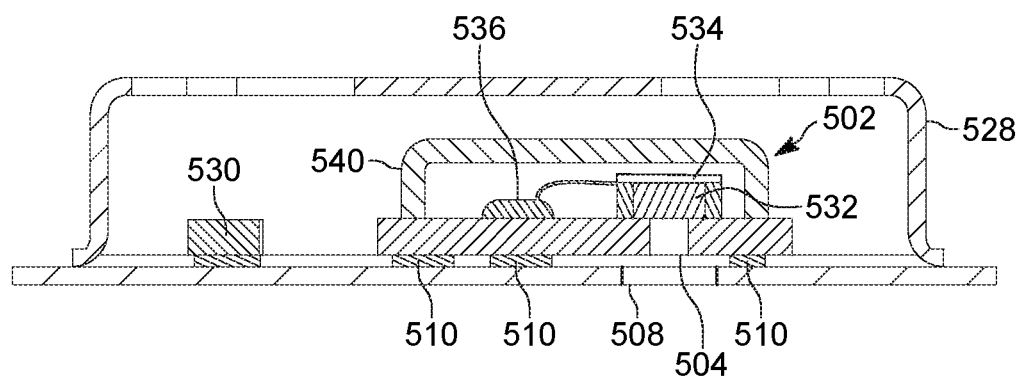
Figure 5C:
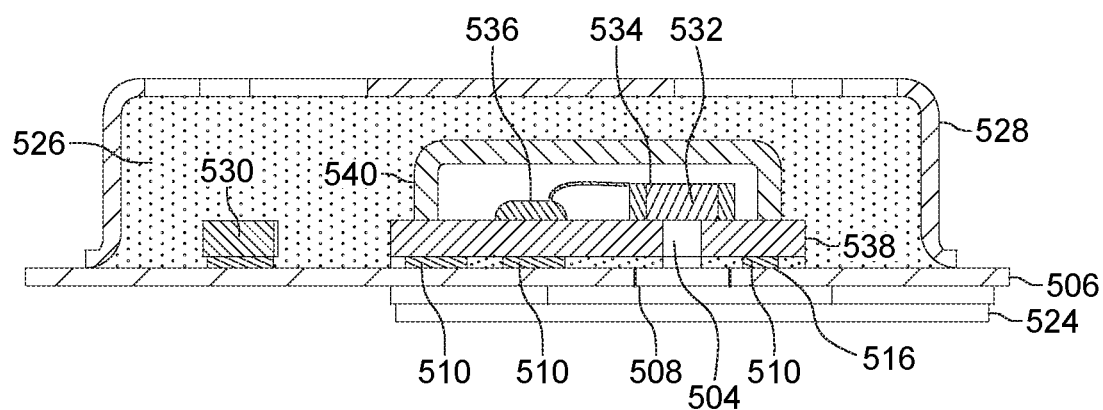

The embodiments of FIGS. 1-4 have provided for a microphone packaging assembly for a MEMs device without requiring any physical changes to an off-the shelf MEMS device. The embodiments of FIGS. 5A, 5B, and 5C take advantage of the same packaging described in the in the embodiments of FIGS. 1-4. The view of FIG. 5A shows a completed microphone packaging assembly 500 (minus conformal coating). The view of FIG. 5B shows a cross sectional view of the microphone packaging assembly 500 (without the conformal coating). The view of FIG. 5C shows a cross sectional view of the microphone packaging assembly 500 (with the conformal coating). The views of FIGS. 5B and 5C further show the cross-section of the MEMS microphone device.

Referring to FIGS. 5A, 5B, and 5C, there is shown a microphone packaging assembly 500 comprising a microphone device 502 having a bottom acoustic port 504, a printed circuit board 506, shown as a flex pcb, having an acoustic port opening 108 aligning with the bottom acoustic port 504 of the microphone device 502. The microphone packaging assembly 500 further comprises a microphone seal membrane 524, compound 526, a form 528 with open surfaces, and discrete components 530 disposed on a first surface 512 of pcb 506.

Microphone device 502, as previously described, is preferably a bottom-ported surface mountable microelectromechanical (MEMS) microphone device, such as that shown in FIG. 1. The MEMS microphone device may be digital or analog. As seen in the cross section, the microphone device 502 comprises a MEMS transducer 532, a MEMS membrane 534 covering the transducer, and MEMS control circuitry 536 disposed on a top surface of MEMS substrate 538 and covered by a MEMS rear enclosure 540. A bottom surface of the MEMs substrate 538 is soldered to pcb 506 forming soldered bonded connections 550 (formed by solder pads 114 being bonded to corresponding electrical contacts 118 of FIG. 1 and formed by incomplete solder seal 116 having a purposeful acoustic leak being bonded to continuous solder ring 120 of FIG. 1). In accordance with some embodiments, the conformal coating 526 establishes environmental protection for the body of microphone device 502 by surrounding and sealing the MEMS microphone enclosure 540, surrounding and sealing the discrete components 530 of pcb 506, and closing but not completely penetrating the purposeful acoustic leak of incomplete solder seal 116.

Conformal coating materials and processes may be selected, for example, based on temperature-dependent viscosity properties or thixotropic properties to seal (but not penetrate) gaps of pre-determined size (i.e. gaps between outer PCB surface and SMT component underside, normally spanned by solder). Potting processes may also be adjusted to allow for more than one conformal coating materials to be dispensed in a single dispensing operation, wherein the conformal coating material seals the purposeful leak 516 leak in the solder pattern solder 510 (viscosity of first conformal coating material selected for small solder gaps). FIG. 5C shows the conformal coating 526 having been dispensed within the form 528. Again, the conformal coating 526 is intended to seal, but not completely penetrate, the purposeful acoustic leak. As such, the seal membrane 524 is not being used to control the extents of the conformal coating 526. The seal membrane 524 solely serves as front-side water seal.

A front-side water seal is achieved with an air-permeable membrane 524. Effectiveness of the entire water-sealing solution, both the encapsulation by conformal coating 526 and attachment of the front side air-permeable membrane 524 can be evaluated by an acoustic sensitivity frequency response of the microphone acoustic system as previously described.

Figure 6:
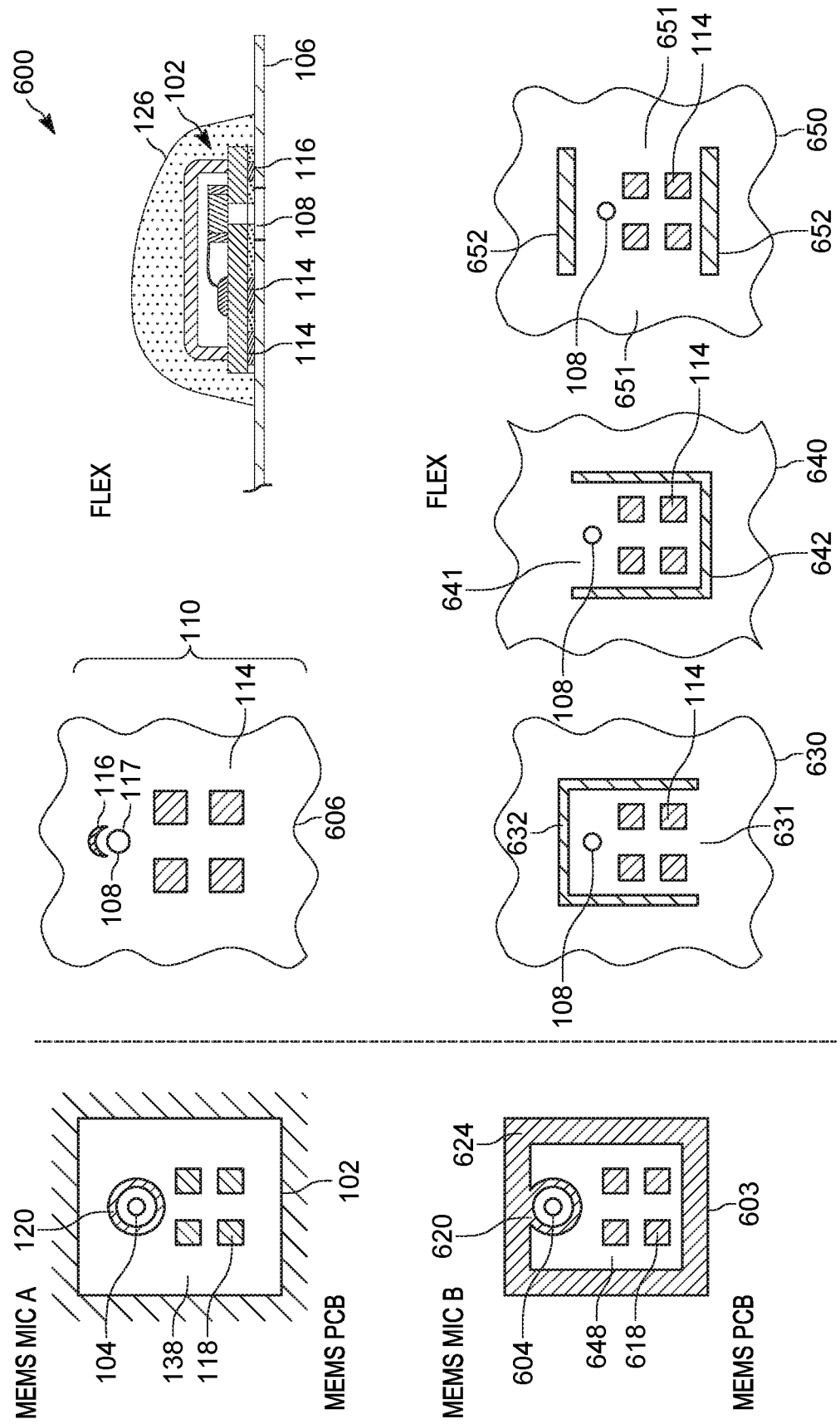
FIG. 6 shows some examples of substrates for the microphone packaging assembly for mounting to bottom ported MEMS microphone devices in accordance with some embodiments.

FIG. 6 shows examples of various substrates 600 for the microphone packaging assembly formed in accordance with the embodiments, that can be mounted to different standard bottom ported MEMS microphone devices 102, 603. The substrates 600 are preferably flex pcb substrates, each substrate having been configured with a solder pad pattern disposed thereon that, in accordance with the embodiments, provides for an electrical interconnect and an incomplete solder seal formed of a solder gap providing a purposeful acoustic leak for the bottom ported microphone device.

Microphone device 102 (MEMS MIC A) is a standard bottom ported MEMS microphone device, similar to that shown in FIG. 1, viewed from the bottom. Microphone device 102 has electrical contacts 118 and continuous circular solder ring 120 surrounding bottom acoustic port 104 on surface mountable MEMS substrate 138. Substrate 106, as was described in FIG. 1, is configured with a solder pattern that provides both electrical interconnect 114 and an incomplete solder seal 116 having a gap 117 formed around acoustic port opening 108 (for example a semi-circle or a dashed circle). The incomplete solder seal 116 and gap 117 together establish a purposeful acoustic leak.

A side view of microphone device 102 (MEMS MIC A) packaged in accordance with some embodiments is also shown in which the substrate 106 is soldered to the microphone device 102 as previously described, and the conformal coating 126 having been disposed thereon so as to encapsulate the MEMS microphone device. In accordance with the embodiments, the conformal coating 126 encapsulates the MEMS device and closes but does not completely penetrate the purposeful acoustic leak of incomplete solder seal 116 thereby forming an environmental seal to the microphone packaging assembly while preserving the open primary acoustic path.

Microphone device 603 (MEMS mic B) is another standard bottom ported MEMS microphone device viewed from the bottom. Microphone device 603 has electrical contacts 618 (which could be fewer or greater contacts than shown) and continuous solder ring 620 disposed around acoustic port 604 on a bottom surface of surface mountable substrate 648. However, the continuous solder ring 620 of MEMS mic B leads into a continuous perimeter solder edge 624, which is another standard option in MEMS packaging. In accordance with the embodiments, example substrates 630, 640 650, can take advantage of the fact that the MEMS microphone device has a continuous solder ring 620 that leads into continuous perimeter solder edge 624, by providing the substrates 630, 640 650 with an edge perimeter solder pattern having gaps formed therein. The substrate's edge perimeter solder pattern with gaps formed therein provides interconnect to the continuous perimeter solder edge 624 and thus interconnect to GND. Each substrate 630, 640 650, preferably a flex substrate, is configured as has been previously described with a solder pattern 110 that provides both electrical interconnects 114 and may but is not required to have the incomplete solder seal 116 of FIG. 1 around acoustic port opening 108. The embodiments for MEMS mic B show substrates 630. 640, 650 without any solder seal around acoustic port opening 108. In accordance with this further embodiment, each substrate 630, 640 650 is respectively provided with incomplete perimeter solder seals 632, 642, 652 with respective gaps 631, 641, 651 formed therein. Together, the incomplete perimeter solder seals 632, 642, 652 with respective gaps 631, 641, 651 formed therein establish purposeful acoustic leaks along the edge of each substrate.

In accordance with this further embodiment, each substrate's incomplete perimeter seal is configured to have the purposeful acoustic leak by disposing a solder pattern having at least one gap 631, 641, 651 that prevents closing off the continuous perimeter solder edge 624 of the MEMS substrate 648 when soldered thereto. Once soldered together, the interconnection forms a controlled barrier which further facilitates conformal coating dispensation. As has been described with the side view of packaged MEMS MIC A, the conformal coating 126 is dispensed so as to seal the perimeter of the MEMS microphone device (Mic A or Mic B), and may further be dispensed, to close but not completely penetrate the port opening 108 thereby providing an additional acoustic seal.

Accordingly, there has been provided an improved microphone packaging assembly for a bottom ported microphone device. Unlike traditional packaging implementations where a complete acoustic seal is utilized, the embodiments have provided for packaging assembly that provides a substrate with a solder pattern disposed thereon that provides an incomplete solder seal with a purposeful acoustic leak. The microphone device is reflowed so as to intentionally retain the purposeful acoustic leak around the microphone port. Past production issues in ensuring an acoustic seal between a continuous solder ring to a continuous solder pad have been eliminated by the use of the continuous solder ring to a non-continuous solder pad and compound approach of the embodiments. The addition of the conformal coating to the packaging assembly results in a built-in acoustic detection feature that will reveal a breach of the potted external acoustic/water seal. The packaging assembly advantageously provides for a shorter acoustic length which eliminates the need for a backing stiffener. The packaging assembly facilitates testing via a single acoustic test which confirms both acoustic and water sealed performance thereby enhancing test time and reliability. The microphone packaging assembly provides a fully-featured yet size-reduced packaged MEMS microphone device that can be mounted to the wet side of a communication device, even on remote external oblique surface facet locations. The ability to mount the device so flexibly facilitates beam-forming for improved speech recognition functionality with addition to push-to-talk audio.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus, comprising:
   a substrate having first and second opposed surfaces, the substrate comprising:
   an acoustic port opening, the acoustic port opening being a hole formed through the first and second opposed surfaces; and
   a solder pattern formed of a partial solder ring with a solder gap disposed on the first surface of the substrate around the acoustic port opening thereby establishing an incomplete solder seal around the acoustic port opening, the incomplete solder seal providing both electrical connection and a purposeful acoustic leak for a bottom ported microphone device.

2. The apparatus of claim 1, further comprising:
   a conformal coating that closes but does not completely penetrate the purposeful acoustic leak.

3. The apparatus of claim 2, wherein the solder pattern providing the incomplete solder seal having the solder gap is disposed around the acoustic port opening of the substrate for soldering to a continuous solder ring of the bottom ported microphone device.

4. The apparatus of claim 2, further comprising:
   discrete components mounted to the substrate; and
   a conformal coating that closes but does not completely penetrate the purposeful acoustic leak of the incomplete solder seal, the conformal coating establishing environmental protection for the bottom ported microphone device and the discrete components.

5. The apparatus of claim 1, wherein the electrical connection provided by the incomplete solder seal is a ground (GND) connection.

6. A microphone packaging assembly, comprising:
   a microphone device having a bottom acoustic port;
   a printed circuit board (pcb) coupled to the microphone device, the pcb having first and second opposed surfaces, the pcb comprising:
   an acoustic port opening, the acoustic port opening being a hole formed through the first and second opposed surfaces, the hole aligning with the bottom acoustic port of the microphone device;
   a solder pad pattern formed of a partial solder ring with a solder gap disposed on the first surface of the pcb around the acoustic port opening, the solder pad pattern providing attachment of the microphone device to the pcb, the solder pad pattern establishing an incomplete solder seal around the acoustic port opening, the incomplete solder seal providing both:
   electrical connection to the microphone device; and
   a purposeful acoustic leak for the bottom acoustic port of the microphone device.

7. The microphone packaging assembly of claim 6, wherein the purposeful acoustic leak establishes an acoustic path between the pcb and the bottom acoustic port of the microphone device.

8. The microphone packaging assembly of claim 6, further comprising:
   a conformal coating closing but not completely penetrating the purposeful acoustic leak thereby establishing environmental protection for the microphone packaging assembly.

9. The microphone packaging assembly of claim 6, further comprising:
a membrane seal mounted to an opposing surface of the pcb, the membrane seal covering the acoustic port opening of the pcb.

10. The microphone packaging assembly of claim 9, wherein the membrane seal comprises a water-proof and air-permeable membrane.

11. The microphone packaging assembly of claim 6, further comprising:
a form coupled to the pcb, the form defining a volume around the microphone device, the volume being filled with a conformal coating.

12. The microphone packaging assembly of claim 6, wherein an effectiveness of water seal and acoustic seal for the microphone packaging assembly are both verifiable via a single acoustic sensitivity response.

13. The microphone packaging assembly of claim 6, wherein the printed circuit board is a flexible printed circuit board.

14. The microphone packaging assembly of claim 6, wherein the microphone device with bottom acoustic port is a surface mount (SMT) microelectromechanical (MEMS) microphone device.

15. The microphone packaging assembly of claim 6, wherein the electrical connection provided by the incomplete solder seal is a ground (GND) connection.

16. A portable radio, comprising:
a radio housing having an exposed exterior surface;
a printed circuit board (pcb) mounted to the exposed exterior surface of the radio housing, the pcb having first and second opposed surfaces having an acoustic port opening, the acoustic port opening being a hole through the first and second opposed surfaces, the first surface of the pcb having a solder pattern disposed thereon, the solder pattern formed of a partial solder ring with a solder gap disposed around the acoustic port opening;
a microphone device having a bottom acoustic port, the microphone device being soldered to the solder pattern thereby aligning the bottom acoustic port with the acoustic port opening of the pcb; and
the solder pattern of the pcb formed of the partial solder ring with solder gap establishing an incomplete solder seal around the acoustic port opening, the incomplete solder seal providing both an electrical connection to the microphone device and a purposeful acoustic leak around the bottom acoustic port of the microphone device on the exposed exterior surface of the radio housing.

17. The portable radio of claim 16, further comprising:
a conformable coating encapsulating the microphone device without blocking the purposeful acoustic leak.

18. The portable radio of claim 16, further comprising:
a form having an open surface, the form being attached to the first surface of the pcb around the microphone device and being filled with a conformable coating.

19. The portable radio of claim 18, wherein the conformal coating provides an interlocking bond between the form, the microphone device, and the first surface of the pcb.

20. The portable radio of claim 18, further comprising:
a membrane seal mounted to the second surface of the pcb over the acoustic port opening of the pcb.

21. The portable radio of claim 18, wherein the exposed exterior surface of the radio housing is exposable to wet, corrosive conditions.

22. The portable radio of claim 16, wherein the exposed exterior surface of the radio housing is a facetted surface, and the pcb is a flex pcb upon which are mounted a plurality of the microphone devices, each microphone device being encapsulated by a conformable coating, the conformal coating for closing but not completely penetrating the purposeful acoustic leak.

23. The portable radio of claim 16, wherein the electrical connection provided by the incomplete solder seal is a ground (GND) connection.

* * * * *